(12) United States Patent
Klockenkaemper et al.

(10) Patent No.: US 11,329,009 B2
(45) Date of Patent: May 10, 2022

(54) METHOD FOR PRODUCING A SEMICONDUCTOR DEVICE, AND SEMICONDUCTOR DEVICE

(71) Applicant: Infineon Technologies AG, Neubiberg (DE)

(72) Inventors: Stefan Klockenkaemper, Lichtenau (DE); Martin Schulz, Erwitte (DE); Ajay Kumar Tejaswi Konakanchi, Allagen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/012,902

(22) Filed: Sep. 4, 2020

(65) Prior Publication Data

US 2021/0074654 A1 Mar. 11, 2021

(30) Foreign Application Priority Data

Sep. 10, 2019 (DE) .......................... 102019124219.3
Jan. 13, 2020 (DE) .......................... 102020100584.9

(51) Int. Cl.
| | |
|---|---|
| *H01L 23/00* | (2006.01) |
| *H01L 23/367* | (2006.01) |
| *H01L 23/473* | (2006.01) |
| *H01L 23/58* | (2006.01) |
| *H01L 21/50* | (2006.01) |

(52) U.S. Cl.
CPC ............ *H01L 23/564* (2013.01); *H01L 21/50* (2013.01); *H01L 23/3677* (2013.01); *H01L 23/473* (2013.01); *H01L 23/585* (2013.01)

(58) Field of Classification Search
CPC . H01L 23/564; H01L 23/3677; H01L 23/473; H01L 23/585; H01L 21/50
See application file for complete search history.

(56) References Cited

U.S. PATENT DOCUMENTS

| | | | |
|---|---|---|---|
| 5,064,165 A | 11/1991 | Jerman | |
| 2003/0053294 A1* | 3/2003 | Yamada | H05K 7/20872 361/699 |
| 2008/0285230 A1* | 11/2008 | Bojan | H05K 7/20872 361/689 |
| 2019/0368413 A1* | 12/2019 | Carter | H05K 7/20218 |

FOREIGN PATENT DOCUMENTS

| | | |
|---|---|---|
| DE | 10239407 A1 | 3/2004 |
| DE | 102014114014 A1 | 4/2015 |
| DE | 102016102152 A1 | 9/2016 |
| EP | 1887847 A1 | 2/2008 |

* cited by examiner

*Primary Examiner* — Peniel M Gumedzoe
(74) *Attorney, Agent, or Firm* — Murphy, Bilak & Homiller, PLLC

(57) ABSTRACT

A method for producing a semiconductor device includes providing a carrier configured to carry at least one semiconductor chip on a first side, and dispensing a polymer onto a second side situated opposite the first side in order to produce a sealing ring. The polymer is dispensed in such a way that the sealing ring produced has different heights perpendicular to the second side along its circumference.

16 Claims, 5 Drawing Sheets

METHOD FOR PRODUCING A SEMICONDUCTOR DEVICE, AND SEMICONDUCTOR DEVICE

TECHNICAL FIELD

The present disclosure relates to a semiconductor device, and to a method for producing a semiconductor device.

BACKGROUND

Semiconductor devices, in particular power modules, can generate considerable heat during operation. It may be necessary to dissipate this heat from the semiconductor device in order to avoid damage thereto and/or in order to ensure efficient operation of the semiconductor device. Direct liquid cooling, in which a carrier of the semiconductor device is in direct contact with a cooling fluid, is one particularly efficient possibility for dissipating heat. In this case, it is necessary to ensure the tightness of the liquid cooling, which can increase the technical complexity of the semiconductor device and also the production costs. Improved methods for producing a semiconductor device and improved semiconductor devices can help to solve this problem and other problems.

The object on which the invention is based is achieved by means of the features of the independent patent claims. Advantageous configurations and developments of the invention are specified in the dependent claims.

SUMMARY

Individual examples relate to a method for producing a semiconductor device, the method comprising: providing a carrier configured to carry at least one semiconductor chip on a first side, dispensing a polymer onto a second side situated opposite the first side in order to produce a sealing ring, wherein the polymer is dispensed in such a way that the sealing ring produced has different heights perpendicular to the second side along its circumference.

Individual examples relate to a semiconductor device, comprising: a carrier, configured to carry at least one semiconductor chip on a first side, a first sealing ring composed of a polymer on a second side situated opposite the first side, wherein the first sealing ring has different heights perpendicular to the second side along its circumference.

BRIEF DESCRIPTION OF THE DRAWINGS

The accompanying drawings illustrate examples and together with the description serve to elucidate the principles of the disclosure. The elements in the drawings are not necessarily true to scale with respect to one another. Identical reference signs may designate mutually corresponding, similar or identical parts.

DETAILED DESCRIPTION

Although one specific feature or one specific aspect of one example may have been disclosed in relation to just one of a plurality of implementations, such a feature or such an aspect can furthermore be combined with one or more other features or aspects of the other implementations, such as may be desired and advantageous for any given or specific application, unless something to the contrary is specifically indicated or there is a technical limitation. Insofar as the terms "contain", "have", "having" or other variations thereof are used, either in the detailed description or in the claims, these terms are intended furthermore to have an inclusive meaning in a similar manner to the term "comprise".

Semiconductor devices that can contain one or more semiconductor chips are described below. The semiconductor chips can be of different types and can be produced by different technologies. The semiconductor chips can be designed for example as power semiconductor chips, such as, for instance, power MOSFETs (metal oxide semiconductor field effect transistors), IGBTs (insulated gate bipolar transistors), JFETs (junction field effect transistors), power bipolar transistors or power diodes.

Figure 1A:
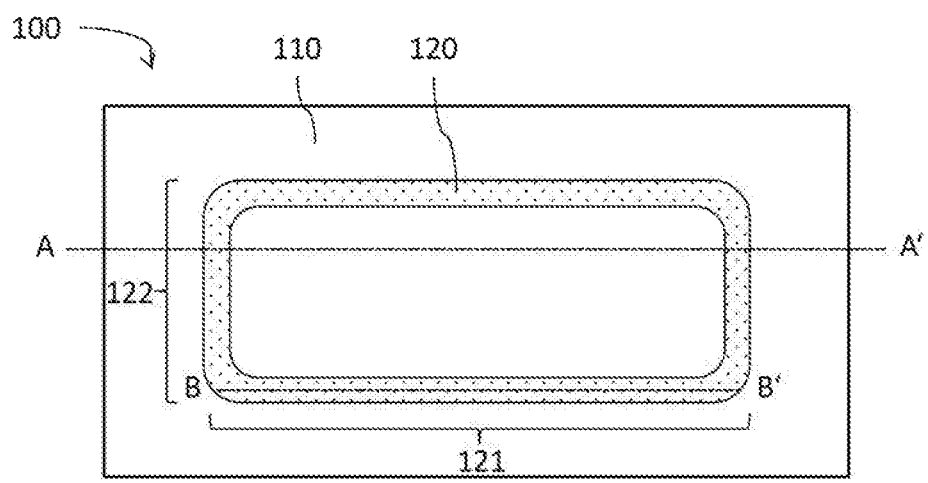
FIGS. 1A to 1C show a semiconductor device comprising a sealing ring, and also a cooling fluid channel, which is sealed by means of the sealing ring at the semiconductor device.
Figure 1B:
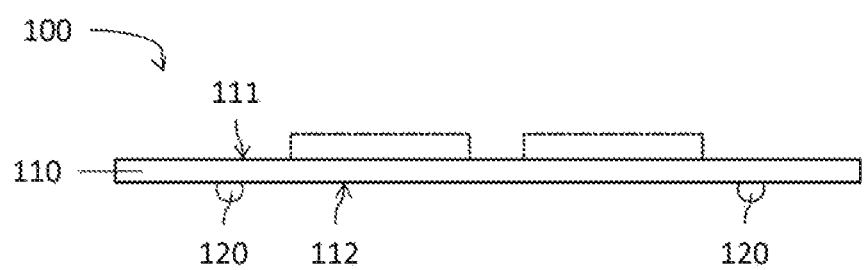

FIG. 1A shows a plan view of a semiconductor device 100 comprising a carrier 110 and a first sealing ring 120, and FIG. 1B shows a sectional view along the line A-A' in FIG. 1A.

The semiconductor device 100 can be, e.g., a power semiconductor module configured to be operated with high voltages and/or high currents. The semiconductor device 1 can comprise one or more semiconductor chips, which can realize any desired circuit, e.g. a rectifier circuit, an inverter circuit, a half-bridge circuit, etc.

The carrier 110 can be configured to carry one or more semiconductor chips (depicted by dashed lines in FIG. 1B) on a first side 111. The carrier 110 very generally consists of thermally conductive material. The carrier 110 can generally comprise or consist of a metal such as Al, Cu or Fe or a metal alloy. The carrier 110 can have a layer structure of one or more electrically conductive layers and one or more electrically insulating layers (e.g. a ceramic layer). The carrier 110 can have e.g. a substrate and/or a baseplate. The substrate can be, e.g., a substrate of the type DCB (direct copper bond), DAB (direct aluminum bond), AMB (active metal brazing) or a part of a leadframe. The substrate can be additionally mounted onto a baseplate, e.g., by means of soldering, sintering, adhesive bonding, etc., wherein the baseplate can extend circumferentially beyond the substrate.

The first sealing ring 120 is arranged on a second side 112 situated opposite the first side 111. The first side 111 can be configured to electrically connect one or more semiconductor chips to one another or to terminals such as, for instance, external terminals of the semiconductor device 100. The first side 111 can be configured to be at least partly covered with a covering, e.g., a (hard) plastic frame or an encapsulation body.

The first sealing ring 120 can have, e.g., a substantially rectangular circumference having a long side 121 and a short side 122, as shown in FIG. 1A. However, it is also possible for the sealing ring 120 to have any other suitable contour, e.g. square, round, irregular, etc.

As shown in the cross section in FIG. 1B, the second side 112 of the carrier 110 can be smooth, such that the first sealing ring 120 is not arranged in a cutout, but rather on a substantially smooth surface of the carrier 110.

The second side 112 of the carrier 110 can be configured to the effect that a cooler structure is arranged on it. Such a cooler structure can serve to dissipate heat generated by semiconductor chips arranged on the first side 111. By way of example, a cooling fluid channel can be arranged on the second side 112. The cooling fluid can be, e.g., water, glycol, etc.

Figure 1C:
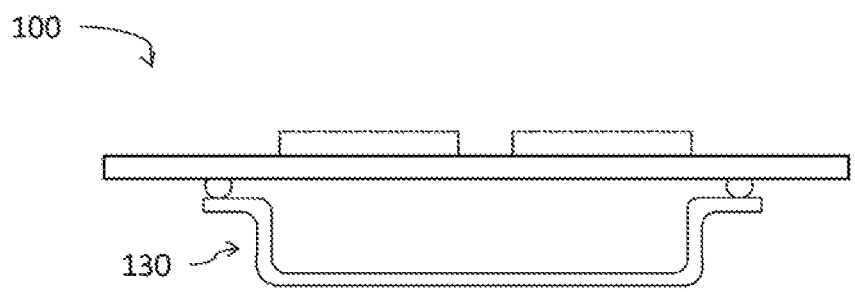

FIG. 1C shows one example of a cooling fluid channel 130 arranged on the second side 112. The cooling fluid channel 130 can comprise or consist of, e.g., metal, a metal alloy and/or plastic. The cooling fluid channel 130 can be secured to the second side 112 by securing means such as screws, clamps or adhesives.

The sealing ring 120 can be configured to seal a cooling structure such as the cooling fluid channel 130, for instance, if the latter is arranged on the second side 112. In particular, the sealing ring 120 can be configured to be tight at a pressure of the cooling fluid of 5 bar or more.

In accordance with one example, the carrier 110 can have a curvature, e.g. in such a way that the carrier 110 is curved in the center toward the cooling fluid channel 130. Such a curvature can contribute to improving a contact pressure between the carrier 110 and the cooling fluid channel 130 in those regions of the carrier 110 which are remote from securing means such as screws, for instance. This can improve the tightness of the first sealing ring 120.

Figure 2:
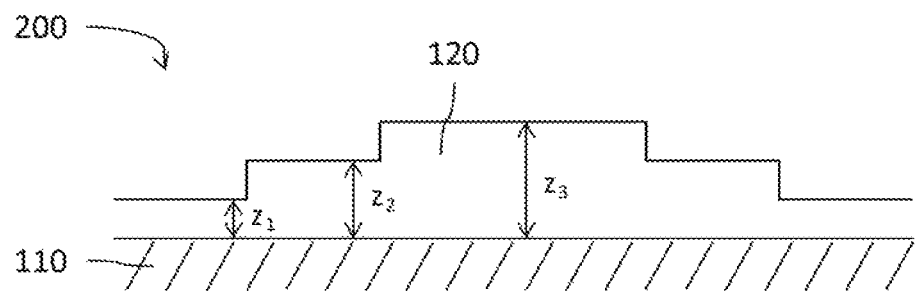
FIG. 2 shows a height profile of a sealing ring along the circumference thereof.

FIG. 2 shows a schematic height profile 200 of the first sealing ring 120 along the line B-B' in FIG. 1A. The first sealing ring 120 has different heights z perpendicular to the second side 112 along its circumference.

In accordance with one example, the height of the first sealing ring 120 can change in a stepped manner along the circumference of said first sealing ring, as shown in FIG. 2. However, it is also possible for the height to change gradually. In the case of a stepped height profile, the sides and/or corners need not necessarily be sharp, as shown in the schematic illustration in FIG. 2, but rather can also be rounded or continuous.

The example in FIG. 2 shows that the height of the first sealing ring 120 is greater in a central part of the long side 121 than in the outer regions of the long side 121. However, it is also possible for the height of the first sealing ring 120 to be greater, e.g., in the outer regions than in the central region of the long side 121. It goes without saying that the first sealing ring 120 can have different heights along its circumference even if it does not have a rectangular circumference having the long side 121 and the short side 122 as in the example in FIG. 1A.

By way of example, a cooler structure such as the cooling fluid channel 130 can be secured to the second side 112 of the carrier 110 by means of screws and the first sealing ring 120 can have a small height in regions that are close to the screws and a larger height in regions that are further away from the screws.

Generally, the first sealing ring 120 can have a greater height in those regions of its circumference in which the contact pressure between the carrier 110 and the cooling fluid channel 130 is lower than in other regions. This may be the case, as described above, e.g. in those regions which are arranged comparatively far away from securing means such as screws, for instance. The greater height of the first sealing ring 120 in these regions makes it possible to compensate for the lower contact pressure and thus to ensure that the first sealing ring 120 effectively seals the cooling fluid channel 130.

In accordance with one example, the first sealing ring 120 can have a first height $z_1$ of approximately 0.6 mm in a first region (which can be arranged e.g. close to a securing means such as a screw, or which has a comparatively high contact pressure). The first sealing ring 120 can have a second height $z_2$ of approximately 0.8 mm e.g. in a second region (which can be further away from the securing means than the first region, or which has a lower contact pressure). The first sealing ring 120 can have a third height of approximately 1.0 mm, e.g., in a third region (which can be even further away from the securing means than the second region, or which has an even lower contact pressure).

In accordance with a further example, the first height $z_1$ can be approximately 60%, and the second height $z_2$ approximately 80%, of the third height $z_3$.

In accordance with one example, the first region having the height $z_1$ and the second region having the height $z_2$ can amount in each case to approximately 20% or less of the length of the long side 121 of the first sealing ring 120. The third region having the height $z_3$ can amount to approximately 30% or more of the length of the long side 121.

Figure 3:
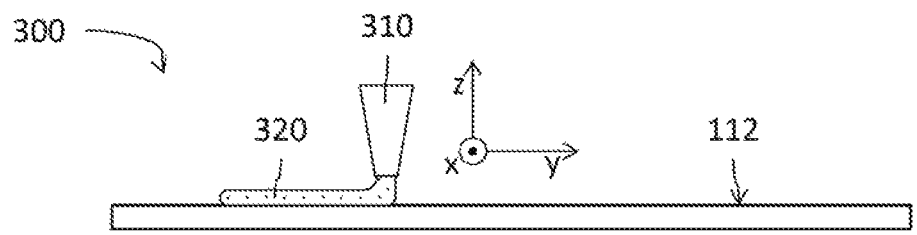
FIG. 3 shows a method for producing a semiconductor device, according to which a sealing ring is applied by dispensing onto a carrier.

FIG. 3 shows a dispensing method 300 for producing a sealing ring. The dispensing method 300 can be used, e.g., to produce the first sealing ring 120.

In accordance with the dispensing method 300, a pasty composition 320 is dispensed onto the second side 112 of the carrier 110 by means of a dispensing nozzle 310. The pasty composition 320 comprises a polymer for forming the first sealing ring 120. The polymer can comprise, e.g., a silicone, an acrylic or the like. The pasty composition can furthermore comprise a flux.

In accordance with one example, the dispensing nozzle 310 and the carrier 110 can be moved relative to one another in the x-direction and in the y-direction in order to produce the first sealing ring 120. In accordance with one example, the dispensing nozzle 310 and the carrier 110 can furthermore also be moved relative to one another in the z-direction in order to produce the first sealing ring 120.

The different heights of the first sealing ring 120 can be produced for example by the distance between dispensing nozzle 310 and second side 112 being varied, e.g. increased in the regions with greater height. Producing regions with greater height can additionally or alternatively include increasing a dispensing rate of the pasty composition 320 in these regions.

The dispensing method 300 can be carried out, e.g., before the carrier 110 is singulated, e.g. while the carrier 110 is still part of a leadframe strip. The dispensing method 300 can be carried out before or else after one or more semiconductor chips are arranged on the first side 111 of the carrier 110.

After dispensing the pasty composition 320, it is possible to apply a curing process in order to cure the polymer, or to evaporate the flux. The curing can be effected, e.g., by means of the action of heat or by UV radiation.

A description has been given with reference to FIG. 3 that the first sealing ring 120 is applied to the carrier 110 by means of a dispensing method. In accordance with another example, however, it is also possible for the first sealing ring 120 to be an O-ring having different heights along its circumference, which is applied on the carrier 110 by means of a pick-and-place process. During such a pick-and-place process, it is necessary to ensure that the O-ring is oriented correctly on the carrier 110, such that the regions with the different heights are arranged in each case at the correct position on the carrier 110.

Figure 4:
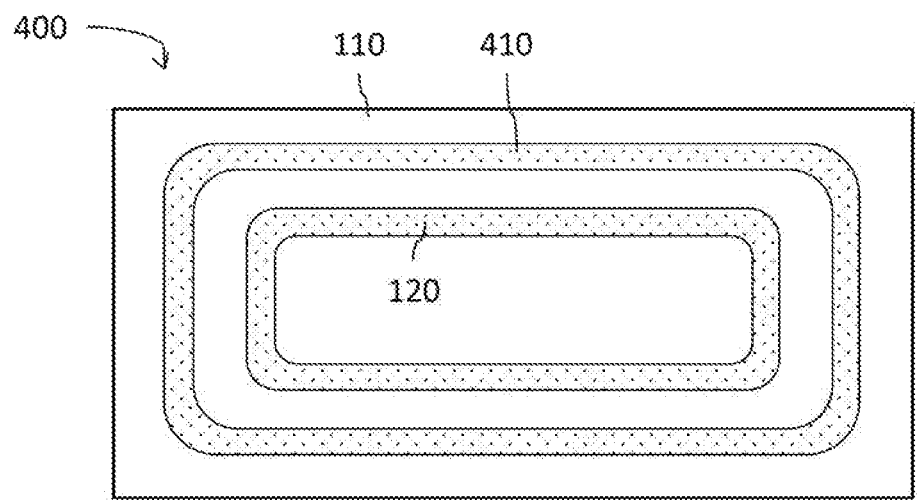
FIG. 4 shows a further semiconductor device comprising two sealing rings in order to obtain redundancy or improved tightness.

FIG. 4 shows a further semiconductor device 400, which can be similar or identical to the semiconductor device 100, apart from the differences described below.

The semiconductor device 400 comprises the carrier 110, the first sealing ring 120 and a second sealing ring 410. The second sealing ring 410 can be arranged, e.g., completely around the first sealing ring 120. The first sealing ring 120 can have different heights along its circumference, as described with reference to FIG. 2. The second sealing ring 410 can likewise have different heights along its circumference. The two sealing rings 120, 410 can have in each case the same height or else different heights, e.g., in identical regions (e.g. regions with an identical contact pressure).

Generally, it is possible to design the heights of the first and second sealing rings 120, 410 relative to one another such that the cooling fluid channel 130 is effectively sealed.

In accordance with one example, however, it is also possible for the two sealing rings 120, 410 of the semiconductor device 400 not to have different heights along their respective circumference. Rather, the use of two sealing rings can be sufficient for effectively sealing the cooling fluid channel 130.

The second sealing ring 410 can likewise be a dispensed sealing ring or an O-ring, as described further above with regard to the first sealing ring 120.

Figure 5:
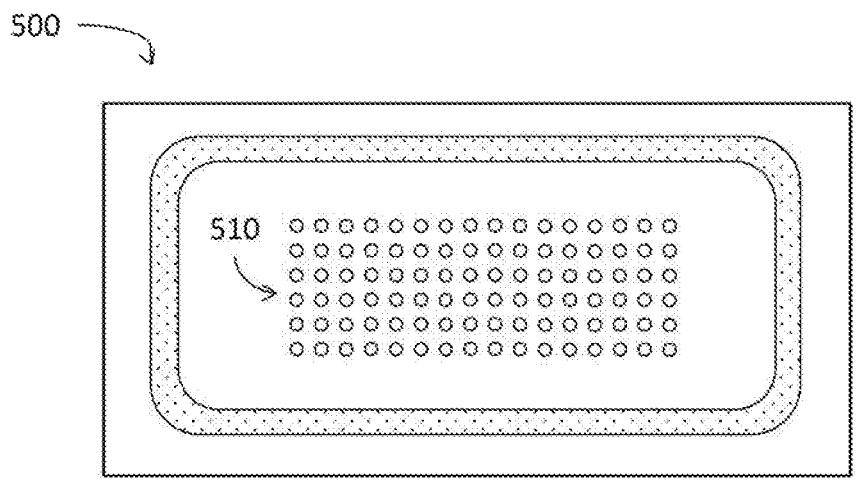
FIG. 5 shows a further semiconductor device comprising cooling fins arranged on a carrier within the sealing ring.

FIG. 5 shows a further semiconductor device 500, which can be similar or identical to the semiconductor devices 100 and 400.

The semiconductor device 500 comprises the carrier 110, the first sealing ring 120 and furthermore cooling fins 510, arranged on the second side 112 of the carrier 110 within the circumference of the first sealing ring 120.

The cooling fins 510 can be designed to improve the thermal contact between the carrier 110 and the cooling fluid in the cooling fluid channel 130. The cooling fins can comprise, e.g., pins (referred to as "pin-fins") or else, e.g., arcuate metal strips or any other suitable structure applied on the second side 112.

Figure 6:
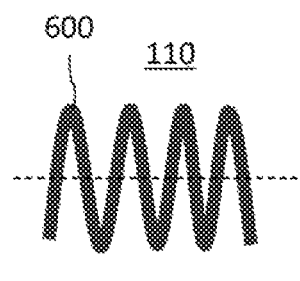
FIG. 6 shows a plan view of an excerpt from a sealing ring having a meandering structure.

FIG. 6 shows a plan view of an excerpt from a sealing ring 600. The sealing ring 600 can be similar or identical to the first sealing ring 120.

The sealing ring 600 has a meandering course along its circumference (indicated by the dashed line in FIG. 6). Said meandering course can be produced, e.g., by the dispensing nozzle 310 being moved in a meandering manner in the xy-plane. The meandering shape can contribute, e.g., to improved tightness of the sealing ring 600. The sealing ring 600 can have the different heights of the first sealing ring 120.

Figure 7:
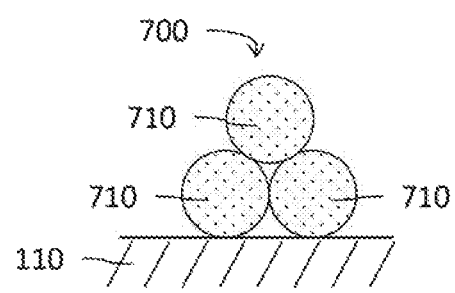
FIG. 7 shows a cross section of a sealing ring consisting of a plurality of partial rings.

FIG. 7 shows a cross section through a further sealing ring 700, which can be similar or identical to the sealing ring 100.

The sealing ring 700 can consist of a plurality of (e.g. three) partial rings 710, which can be arranged next to one another or one above another. The sealing ring 700 can be produced, e.g., by the dispensing nozzle 310 being moved repeatedly along the circumference of the sealing ring 700 and in each case dispensing a partial ring 710 in the process.

Figure 8:
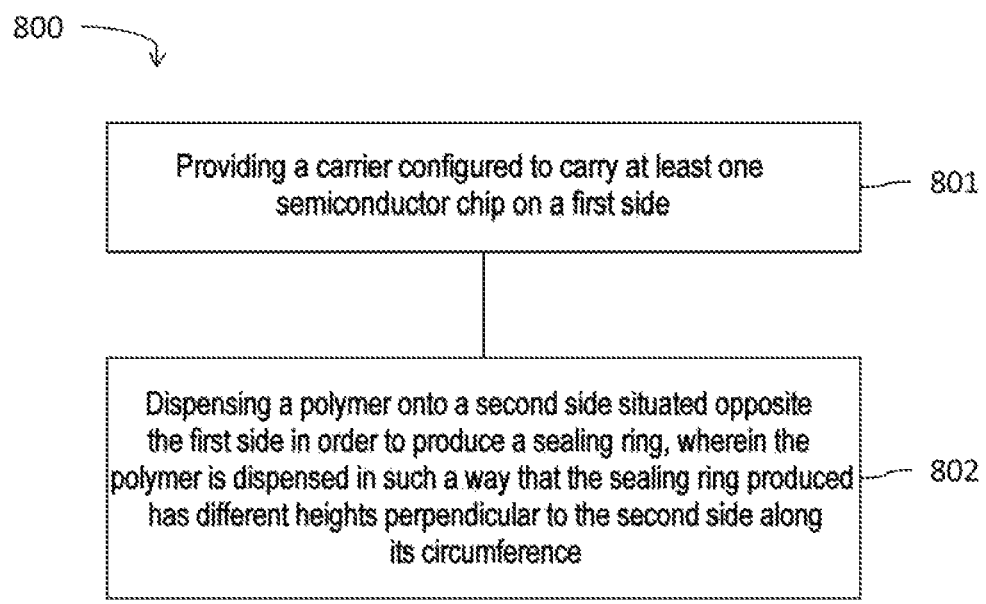
FIG. 8 is a flow diagram of a method for producing a semiconductor device.

FIG. 8 shows a flow diagram of a method 800 for producing a semiconductor device. The method 800 can be used, e.g., to produce the semiconductor devices 100, 400 and 500.

The method 800 comprises, at 801, providing a carrier configured to carry at least one semiconductor chip on a first side, and, at 802, dispensing a polymer onto a second side situated opposite the first side in order to produce a sealing ring, wherein the polymer is dispensed in such a way that the sealing ring produced has different heights perpendicular to the second side along its circumference.

Referring to the semiconductor devices 100, 400, 500, it has been shown that the tightness of the cooling channel can be improved by the use of a sealing ring having a height profile that is variable along the circumference of the sealing ring (e.g. on account of an increase in the contact pressure at those locations at which the sealing ring has a greater vertical thickness). However, it is also possible to achieve the effect of the improved tightness by the carrier 110 on which the sealing ring 120 is arranged having a variable height profile along the circumference of the sealing ring 120. In this case, it is also possible to use a sealing ring 120 without the thickness variations described.

Figure 9A:
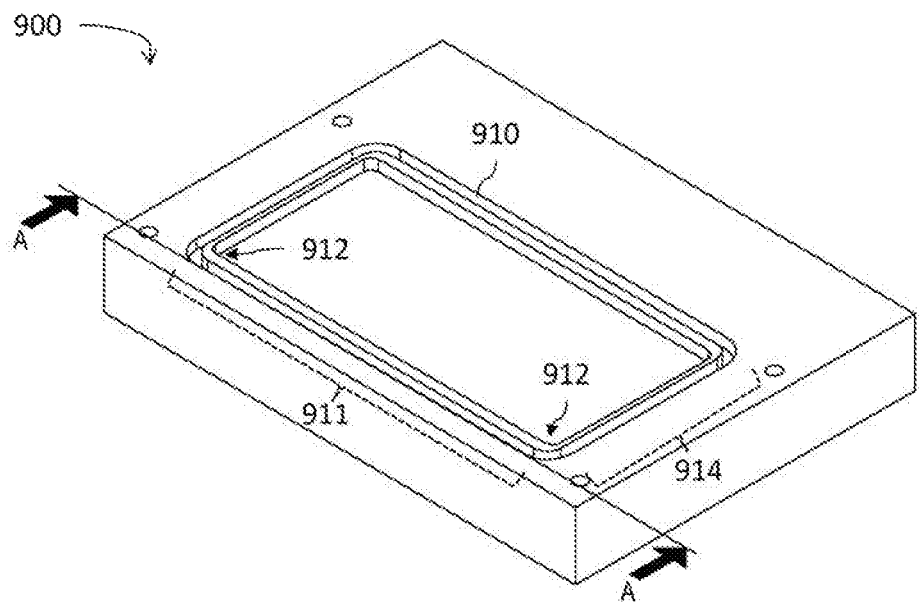
FIGS. 9A and 9B show a carrier having a height profile that is variable along the circumference of a sealing ring.
Figure 9B:
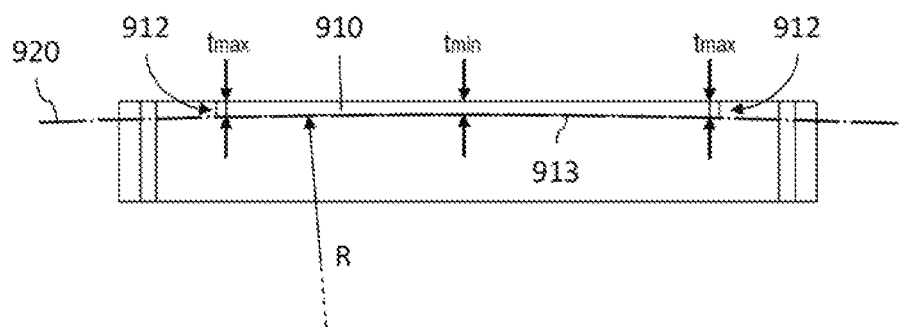

FIGS. 9A and 9B show one example of a carrier 900 having such a variable height profile along the circumference of the sealing ring. FIG. 9A shows a perspective view of the carrier 900 and FIG. 9B shows a sectional view along the line A-A in FIG. 9A.

The carrier 900 can have a cutout 910 configured to receive a sealing ring. As shown in FIG. 9B, the cutout 910 has a depth t that is variable along the longer side 911. The depth t can be greater, e.g., at the (rounded) corners 912 of the cutout 910 than in the center of the longer side 911. By virtue of the variable depth t of the cutout 910, the sealing ring can have different heights perpendicular to the second side of the carrier (to put it another way, the sealing ring can project above the carrier 900 at different heights along its circumference on account of the variable depth t of the cutout 910).

In accordance with one example, a maximum depth $t_{max}$ at the corners 912 can be approximately 3 mm and a minimum depth $t_{min}$ in the center of the longer side 911 can be approximately 2.7 mm or 2.8 mm or 2.9 mm. The ratio of $t_{max}$ to $t_{min}$ can depend on the length of the longer side 911 and/or on the contact pressure to be achieved between the sealing ring and the cooling fluid channel 130 (cf. FIG. 1C).

In accordance with one example, the base 913 of the cutout 910 can form a circle segment 920 (represented by a dash-dotted line in FIG. 9B). The circle segment 920 can be part of a circle having a radius R, wherein R can be for example approximately 230 cm, or approximately 290 cm, or approximately 385 cm, or approximately 580 cm. As described above, the magnitude of the radius R can depend on the length of the longer side 911 and/or the contact pressure to be achieved. In other exemplary embodiments, the base of the cutout can form an ellipse segment or some other suitable shape having a variable depth.

The cutout 910 can have a shorter side 914, which need not have a variable depth. However, it is also possible for the shorter side 914 also to have a variable depth, as explained with regard to the longer side 911.

According to one example, the carrier 900 does not have a cutout 910. Instead, the carrier 900 is designed to receive a sealing ring on a smooth surface, wherein the smooth surface has a variable height profile, as explained with regard to the longer side 911 of the cutout 910.

Furthermore, it is possible for both the sealing ring 120 having a variable height profile and the carrier 900 having a variable depth t along the cutout 910 to be used in a semiconductor device such as the semiconductor devices 100, 400 and 500. The carrier 900 can be used both with a dispensed sealing ring and with an O-ring placed by a pick-and-place process.

The semiconductor device and the method for producing a semiconductor device are explained in greater detail below on the basis of explicit examples.

Example 1 is a method for producing a semiconductor device, the method comprising: providing a carrier configured to carry at least one semiconductor chip on a first side, dispensing a polymer onto a second side situated opposite the first side in order to produce a sealing ring, wherein the polymer is dispensed in such a way that the sealing ring produced has different heights perpendicular to the second side along its circumference.

Example 2 is the method according to example 1, wherein the dispensing is carried out by means of a dispensing nozzle and wherein the different heights are produced by the distance between the dispensing nozzle and the second side and/or a dispensing rate of the polymer being varied.

Example 3 is the method according to example 1 or 2, wherein the polymer is dispensed in such a way that the sealing ring has a substantially rectangular circumference, and wherein the sealing ring has at least partly a greater height along a long side of the substantially rectangular circumference than along a short side.

Example 4 is the method according to any of the preceding examples, wherein producing the sealing ring furthermore comprises curing the polymer by means of heat or UV radiation.

Example 5 is the method according to any of the preceding examples, wherein the polymer is dispensed in a meandering fashion.

Example 6 is the method according to any of the preceding examples, wherein the sealing ring is produced on a smooth, cutout-free part of the second side.

Example 7 is the method according to any of examples 1 to 6, wherein the carrier has a cutout for receiving the sealing ring, wherein the cutout has a variable depth along the circumference of the sealing ring.

Example 8 is a semiconductor device, comprising: a carrier, configured to carry at least one semiconductor chip on a first side, a first sealing ring composed of a polymer on a second side situated opposite the first side, wherein the first sealing ring has different heights perpendicular to the second side along its circumference.

Example 9 is the semiconductor device according to example 8, wherein the carrier comprises a part of a leadframe or a ceramic substrate with an applied routing structure.

Example 10 is the semiconductor device according to example 8 or 9, furthermore comprising: cooling fins arranged on the second side within the circumference of the first sealing ring.

Example 11 is the semiconductor device according to any of examples 8 to 10, wherein the first sealing ring has a substantially rectangular circumference, and wherein the first sealing ring has at least partly a greater height along a long side of the substantially rectangular circumference than along a short side.

Example 12 is the semiconductor device according to any of examples 8 to 11, wherein the carrier has a curvature at least at the second side.

Example 13 is the semiconductor device according to any of examples 8 to 12, furthermore comprising: a second sealing ring, which is arranged around the first sealing ring.

Example 14 is the semiconductor device according to any of examples 8 to 13, wherein the carrier has a cutout for receiving the sealing ring, wherein the cutout has a variable depth along the circumference of the sealing ring.

Example 15 is the semiconductor device according to example 14, wherein the cutout has a longer side, a shorter side and corners, wherein the depth of the cutout is smaller in the center of the longer side than in the corners.

Example 16 is the semiconductor device according to example 14 or 15, wherein a base of the cutout forms a circle segment.

Example 17 is a device comprising means for carrying out the method according to any of examples 1 to 7.

Although specific examples have been illustrated and described herein, it is obvious to the person of average skill in the art that a multiplicity of alternative and/or equivalent implementations can replace the specific examples shown and described, without departing from the scope of the present disclosure. This application is intended to cover all adaptations or variations of the specific examples discussed herein. Therefore, the intention is for this disclosure to be restricted only by the claims and the equivalents thereof.

What is claimed is:

1. A method for producing a semiconductor device, the method comprising:
   providing a carrier configured to carry at least one semiconductor chip on a first side; and
   dispensing a polymer onto a second side situated opposite the first side in order to produce a sealing ring,
   wherein the polymer is dispensed in such a way that the sealing ring produced has different heights perpendicular to the second side along its circumference.

2. The method of claim 1, wherein the dispensing is carried out by a dispensing nozzle, and wherein the different heights are produced by a distance between the dispensing nozzle and the second side and/or a dispensing rate of the polymer being varied.

3. The method of claim 1, wherein the polymer is dispensed in such a way that the sealing ring has a substantially rectangular circumference, and wherein the sealing ring has at least partly a greater height along a long side of the substantially rectangular circumference than along a short side.

4. The method of claim 1, wherein producing the sealing ring further comprises curing the polymer by heat or radiation.

5. The method of claim 1, wherein the polymer is dispensed in a meandering fashion.

6. The method of claim 1, wherein the sealing ring is produced on a smooth, cutout-free part of the second side.

7. The method of claim 1, wherein the carrier has a cutout for receiving the sealing ring, and wherein the cutout has a variable depth along the circumference of the sealing ring.

8. A semiconductor device, comprising:
   a carrier configured to carry at least one semiconductor chip on a first side; and
   a first sealing ring comprising a polymer on a second side situated opposite the first side,
   wherein the first sealing ring has different heights perpendicular to the second side along its circumference.

9. The semiconductor device of claim 8, wherein the carrier comprises a part of a leadframe or a ceramic substrate with an applied routing structure.

10. The semiconductor device of claim 8, further comprising:
    cooling fins arranged on the second side within the circumference of the first sealing ring.

11. The semiconductor device of claim 8, wherein the first sealing ring has a substantially rectangular circumference, and wherein the first sealing ring has at least partly a greater height along a long side of the substantially rectangular circumference than along a short side.

12. The semiconductor device of claim 8, wherein the carrier has a curvature at least at the second side.

13. The semiconductor device of claim 8, further comprising:
   a second sealing ring arranged around the first sealing ring.

14. The semiconductor device of claim 8, wherein the carrier has a cutout for receiving the first sealing ring, and wherein the cutout has a variable depth along the circumference of the first sealing ring.

15. The semiconductor device of claim 14, wherein the cutout has a longer side, a shorter side and corners, and wherein a depth of the cutout is smaller in the center of the longer side than in the corners.

16. The semiconductor device of claim 14, wherein a base of the cutout forms a circle segment.

\* \* \* \* \*